United States Patent [19]

Elms

[11] 4,250,552
[45] Feb. 10, 1981

[54] AC ELECTRIC ENERGY METER UTILIZING A COUNTER AS AN INTEGRATOR

[75] Inventor: Robert T. Elms, Monroeville, Pa.

[73] Assignee: Westinghouse Electric Corp., Pittsburgh, Pa.

[21] Appl. No.: 73,825

[22] Filed: Sep. 10, 1979

[51] Int. Cl.³ .............................................. G01R 21/00
[52] U.S. Cl. .................................. 364/483; 324/142
[58] Field of Search ............... 364/483; 324/142, 141, 324/76 R

[56] References Cited

U.S. PATENT DOCUMENTS

| | | | |
|---|---|---|---|
| 3,758,763 | 9/1973 | Nohara et al. | 324/76 R X |
| 3,764,908 | 10/1973 | Elms | 324/142 |
| 3,794,917 | 2/1974 | Martin | 324/142 |
| 3,838,340 | 9/1974 | Legatti | 324/142 |
| 3,864,631 | 2/1975 | Zitelli et al. | 324/115 |
| 4,056,775 | 11/1977 | Milkovic | 324/142 |
| 4,077,061 | 2/1978 | Johnston et al. | 364/483 |

*Primary Examiner*—Edward J. Wise
*Attorney, Agent, or Firm*—E. L. Pencoske

[57] ABSTRACT

A first input signal representative of the voltage component is integrated producing an integral signal. The integral signal is compared to fixed reference potentials. A second input signal representative of the time derivative of the current component is continuously integrated by a counter producing a signal representative of the current component. When the instantaneous magnitude of the integral signal equals a reference potential the signal representative of the current component is sampled and the integral signal is reset. Each sample value is representative of the product of the current component and the time integral of the voltage component. Successive sample values are accumulated producing totalized values representative of energy.

28 Claims, 11 Drawing Figures

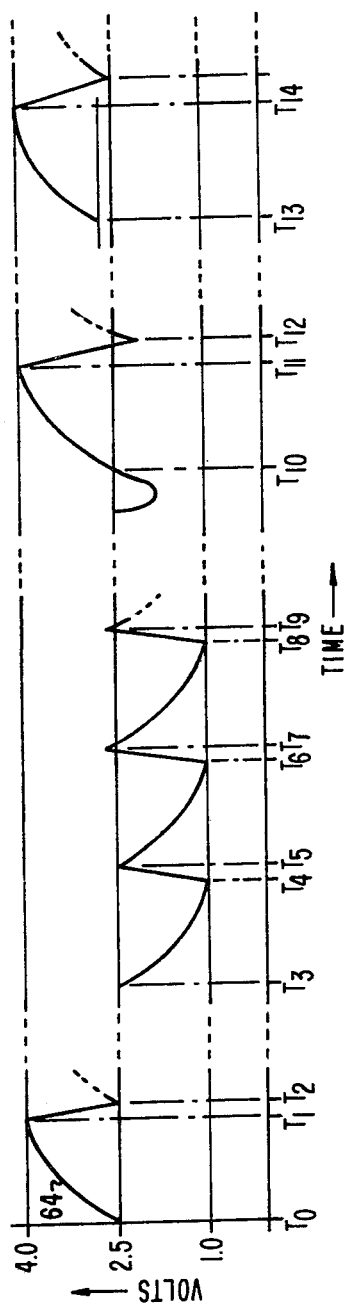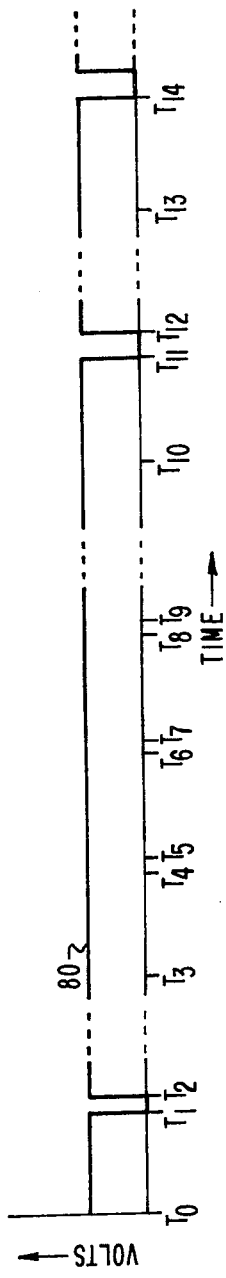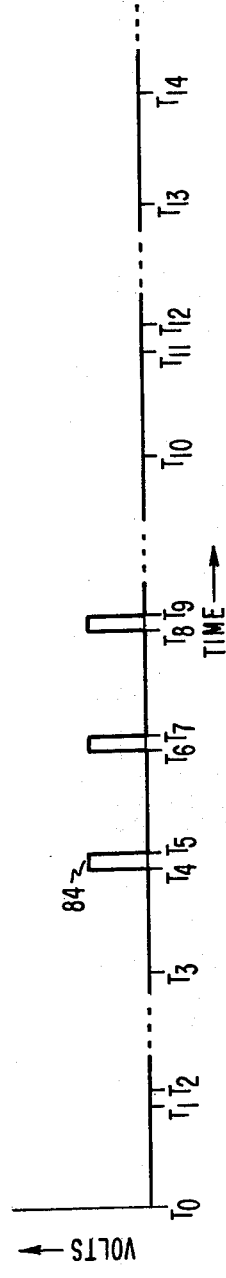

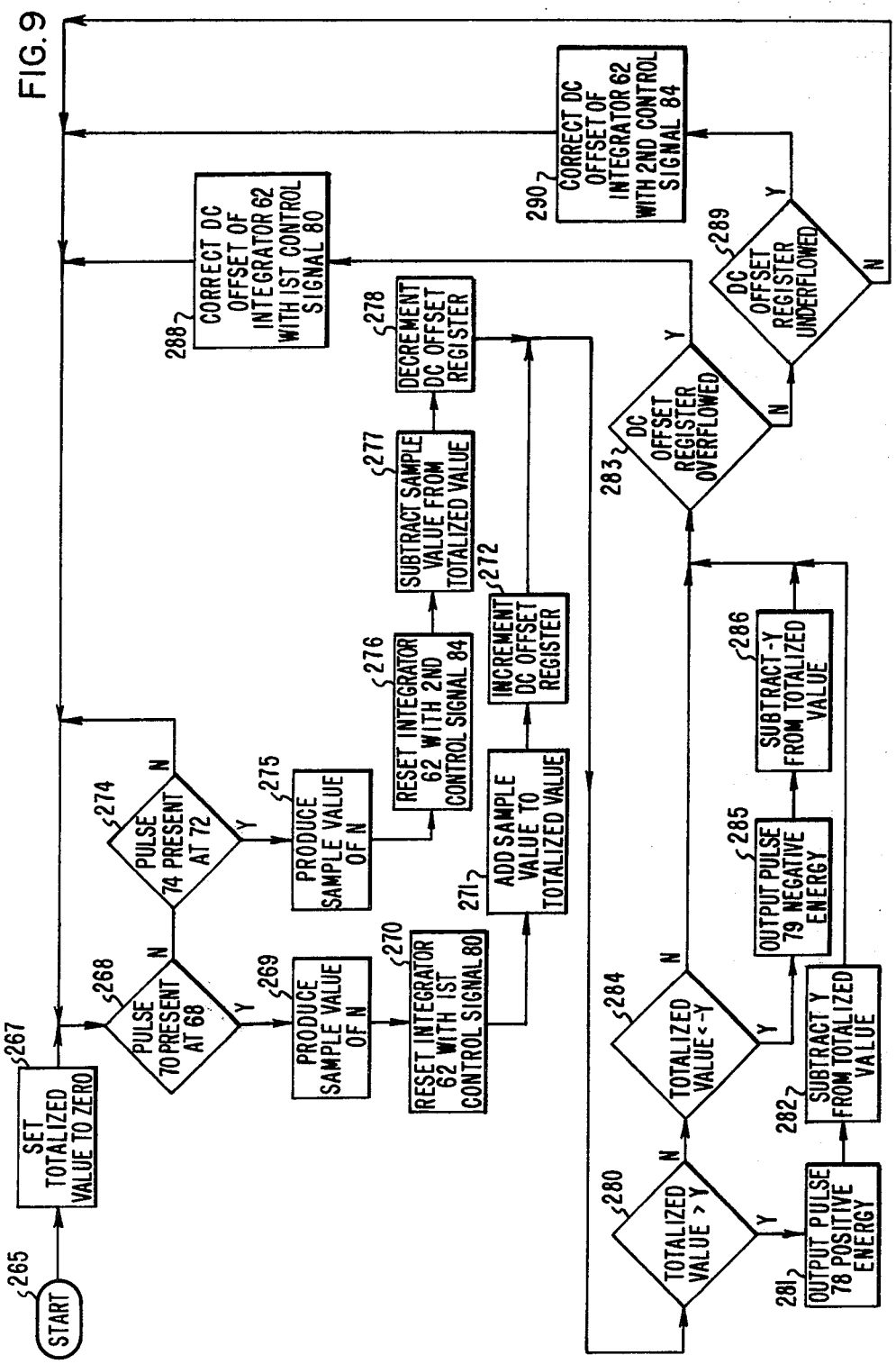

AC ELECTRIC ENERGY METER UTILIZING A COUNTER AS AN INTEGRATOR

BACKGROUND OF THE INVENTION

1. Field of the Invention

The present invention relates to electrical apparatus for measuring AC electrical energy quantities, and more specifically to electrical apparatus implementing indicator diagram principles.

2. Description of the Prior Art

The electromechanical rotating disc type of watthour meter continues to enjoy almost exclusive use in electrical metering applications. However, other apparatus are being sought which will provide additional services, such as load control and time of day metering, on a cost competitive basis. This search has lead to the development of a multitude of apparatus capable of implementing a wide variety of techniques for determining AC electrical energy quantities.

One such technique for determining the value of an electrical energy quantity to be measured is a system based on a conventional analog multiplier circuit for computing the product of the current and voltage components. Such a system is disclosed in U.S. Pat. No. 3,864,631 and is assigned to the assignee of this invention.

A second technique, that is described in U.S. Pat. No. 3,764,908 and is assigned to the assignee of this invention, is for a semiconductor device having a logarithmic computing characteristic. Voltage and current related signals are input to the device which produces an output signal that is equal to the product of the input signals.

Another technique, known as time division multiplication, is illustrated by U.S. Pat. No. 3,794,917. Briefly, a signal proportional to the voltage on an electrical distribution system is sampled to derive a pulse width modulated output signal having a pulse duration proportional to the amplitude of the voltage signal. This signal controls a gating network which samples a current input signal at a rate proportional to the amplitude of the voltage signal. The resultant output signal is the product of the voltage and current and consists of a series of pulses having an amplitude proportional to the magnitude of the instantaneous current and a pulse width proportional to the magnitude of the voltage. This output signal is proportional to the average power consumed by the load and is applied to a voltage to frequency converter which provides a pulse train wherein each pulse is proportional to the total energy consumed. The pulse train is used to drive mechanical counters, magnetic recorders, or electrical counting circuits to thereby provide an indication of the total electrical power consumed by a load.

It has been found that analog electronic multiplying techniques are sometimes difficult to apply in order to obtain the desired accuracies. Accurate, drift-free analog multipliers and square root computing circuits are often expensive and difficult to obtain. Also, analog integration circuits required in the analog electronic power measuring apparatus produce undesired drift and variations over long time intervals. In time division multiplication circuits, it is known that frequency dependent sampling occurs with the associated digital integration also having a similar dependency upon variations of the integrating capacitors.

A further technique, digital processing, is illustrated by U.S. Pat. No. 4,077,061 and is assigned to the assignee of this invention. In this technique, the voltage and current signals are sampled at random intervals and converted into digital form. The digital signals are then processed by a digital computer which computes the instantaneous values of electrical energy quantities and accumulates the instantaneous values of the computed quantity over a predetermined time interval to provide a measurement of various electrical energy quantities.

Ideal digital measuring apparatus utilize analog to digital converters having very high speeds and high resolutions. However, these two characteristics are competing from a design standpoint since more time is needed in order to achieve the higher resolutions. The higher resolution results in binary words of greater lengths which require associated circuitry that is more complex and expensive. Further, complex digital processing circuits capable of operating at high speeds require larger and more expensive power supplies. Slower sampling speeds permit digital processing at lower speeds to simplify the digital processing circuitry. A reduction in resolution permits handling of shorter binary words for producing the digitized binary representations of the analog signal amplitudes. However, the reduced sampling rates and lower digitizing resolution have a corresponding reduction in the accuracy of the digital representations of the sample amplitudes and a reduction in the true digital representation of each complete cycle of the analog input signals.

A still further technique for determining the value of an electrical energy quantity to be measured is a system which determines the area of an indicator diagram. The area enclosed by an indicator diagram is proportional to the instantaneous power per cycle delivered to a load. The system disclosed in U.S. Patent Application Ser. No. 041,446, and assigned to the assignee of this invention is an example of the indicator diagram technique. The area enclosed by the indicator diagram is determined by sampling a signal related to the current component when unit changes occur in the magnitude of the time integral of a signal related to the voltage component. This provides successive sample values of the signal related to the current component. The sample values are representative of the product of the current component and the time integral of the voltage component. Successive sample values are accumulated to produce totalized values which are representative of the time integral of the product of the current component times the time integral of the voltage component. Output signals which are an indication of AC electrical energy are produced in response to the totalized values.

The present invention is an apparatus for implementing this last technique. More specifically, it is a system for computing the area enclosed by an indicator diagram.

SUMMARY OF THE INVENTION

This invention discloses a system for determining the value of an AC electric energy quantity delivered to a load by computing the area enclosed by an indicator diagram. An input signal representative of the time derivative of the current component is input to a circuit producing a count control signal. The count control signal is representative of the time derivative of the current component and is used to control a counter. The counter continuously counts up or down, depending on the count control signal, and produces a digital count representative of the current component.

An input signal representative of the voltage component is applied to an integrator producing an integral signal. The integral signal is compared to fixed and predetermined reference potentials. When the instantaneous magnitude of the integral signal equals the magnitude of one of the reference potentials two events are initiated. First, a sample value of the digital count representative of the current component is produced. Second, the integrator is reset by a direct current pulse having a predetermined time duration and a predetermined magnitude. The sample values are accumulated producing totalized values representative of the time integral of the product of the current component times the time integral of the voltage component. Finally, output signals representative of the AC electric energy quantity are produced in response to the totalized values.

In the present invention the product of the integral signal and the digital count representative of the current component is effectively computed without the use of analog multiplying techniques commonly employed in prior art meter apparatus. This product is also computed without multiplying digital representations of the input signals as it is commonly done in meter apparatus utilizing digital processing and calculating techniques. Also, the present invention utilizes an input signal which is the time derivative of the current component. This type of input signal is extremely accurate and is produced by a current transducer that is smaller in size and costs less than a standard current transformer.

BRIEF DESCRIPTION OF THE DRAWINGS

FIG. 8A illustrates a plot of an output signal of an integrator versus time;

FIGS. 8B and 8C illustrate the plots of control signals versus time; and

FIG. 9 is a flowchart outlining the operation of the present invention.

DESCRIPTION OF THE PREFERRED EMBODIMENT

1. Fundamental Principles

To better understand the present invention and the operation thereof it is appropriate to first discuss two fundamental principles. The first, and broadest of the two principles, is the application of indicator diagrams to AC electrical power measurements. The use of indicator diagrams in the measurement of other types of power, such as the power in steam engines, internal combustion engines, air compressors, etc., is well known. Accordingly, the application of indicator diagrams to the measurement of AC electrical power is also known.

In an electrical power distribution system, the power delivered to a load is defined by a voltage component and a current component. The electrical analog of an indicator diagram is obtained by plotting the time integral of the voltage component versus the current component. The area enclosed by the resulting curve is proportional to the power per cycle (of the current component) delivered to the load. By determining this area once per cycle and then summing successive areas over a predetermined period of time, the energy consumed by the load can be determined.

Figure 1:
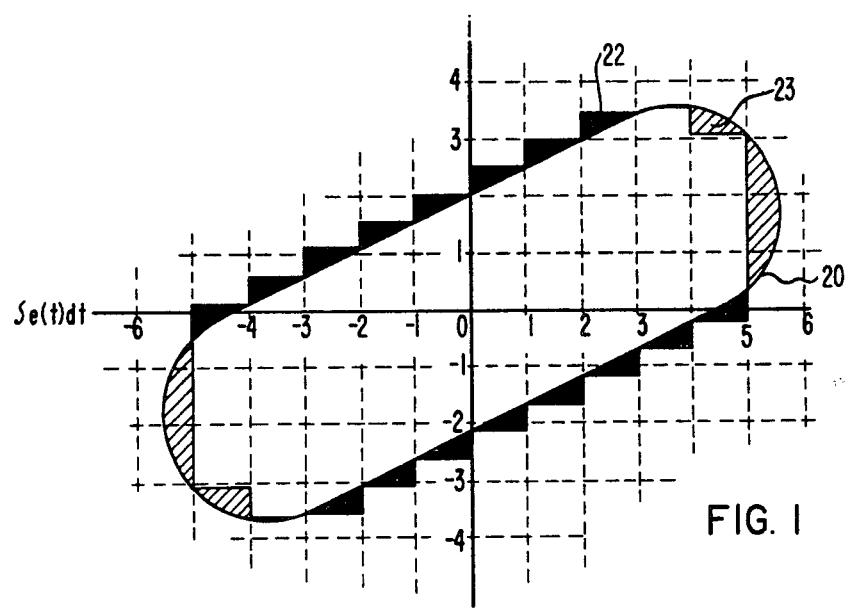
FIG. 1 illustrates an indicator diagram wherein the voltage and current components of an AC electric energy quantity have the same periods.

A simple example of an indicator diagram is shown in FIG. 1. FIG. 1 shows a closed curve 20 which is the result when the voltage component and the current component have the same period, an arbitrary phase relationship, and neither component is changing rapidly from cycle to cycle. The closed curve 20 is retraced one time for each cycle of the current component. To calculate the area enclosed by the curve 20 a grid composed of blocks having a known arbitrary area is superimposed onto the graph and the blocks enclosed by the closed curve 20 are counted.

In a meter apparatus, the area enclosed by the curve 20 is determined by monitoring the time integral of the voltage component. When the time integral of the voltage component equals a unit value (in volts) along the $\int e(t)dt$ axis the current component is sampled. For example, starting at zero, the magnitude of the time integral of the voltage component is monitored until the value of one unit is reached, at which time the current component is sampled. The area enclosed by the curve 20 up to this point in time is two and one half units (in amps) times one unit (in volts) or two and one half units squared (volt-amps). Similarly, when two is reached, another unit value along the $\int e(t)dt$ axis has been reached. The current component is sampled again this time providing a value of three units. Three units times one unit yields three units squared which is added to the previous value. At this point it is apparent that the meter apparatus need not multiply the two samples since all the $\int e(t)dt$ samples are one unit. Therefore, the apparatus need only add, or subtract, the sample values of the current component.

Error is introduced as shown by the shaded areas 22 and the cross-hatched areas 23 since the meter apparatus computes the area as if the current component was a constant value from one unit value along the $\int e(t)dt$ axis to the next unit value. The shaded areas 22 represent areas improperly added to the total area enclosed by the curve 20. The cross hatched areas 23 represent areas improperly subtracted from the total area enclosed by the curve 20. This error can be overcome and the accuracy increased by using a grid system composed of smaller blocks. In terms of the electrical apparatus, this translates into smaller unit values for the time integral of the voltage component and more samples of the current component.

Figure 2:
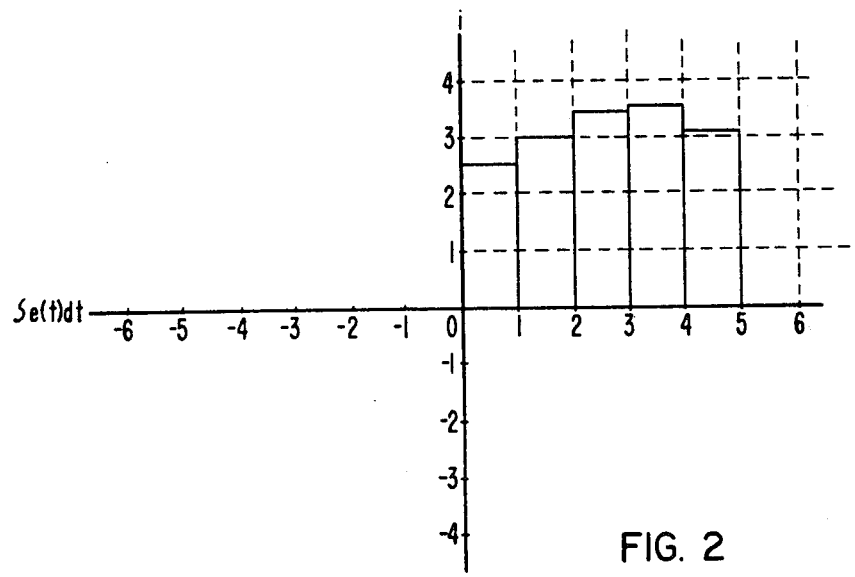
FIGS. 2, 3 and 4 illustrate the sample values produced by a meter apparatus to approximate the area enclosed by the indicator diagram.
Figure 3:
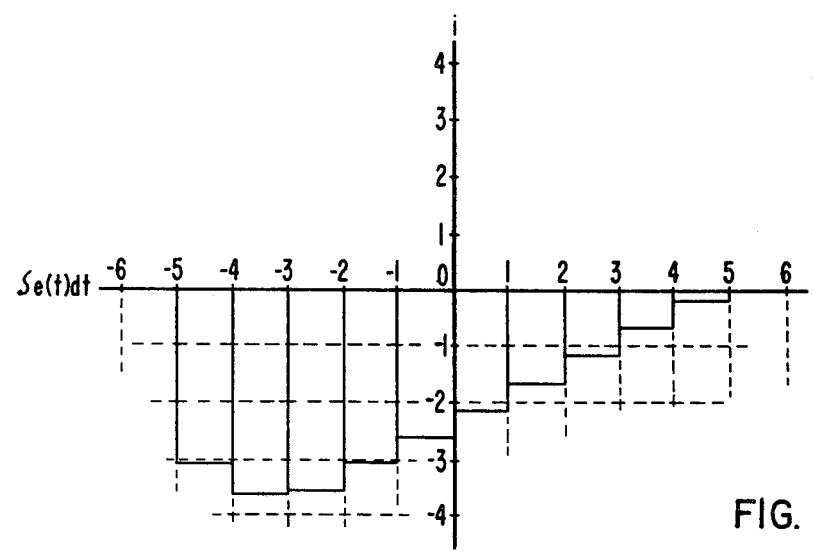
Figure 4:
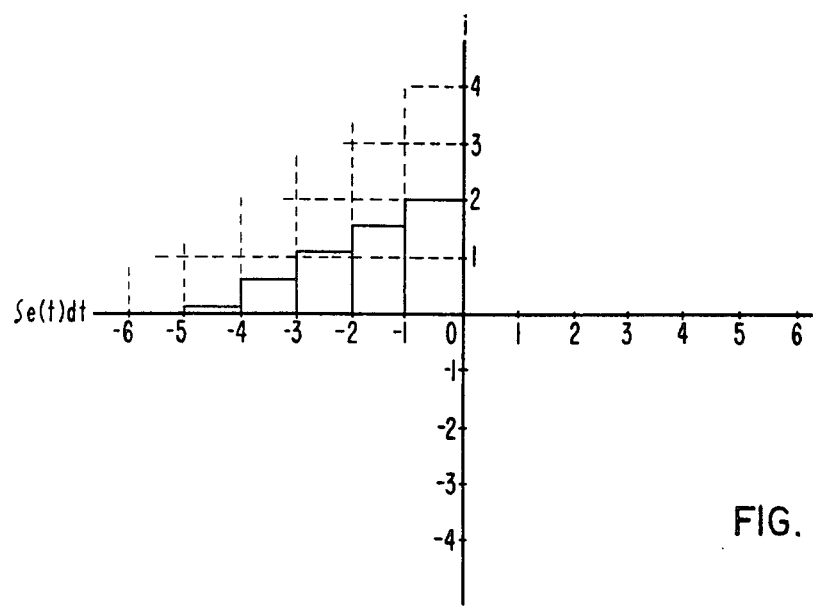

If the time integral of the voltage component is increasing when a sample of the current component is taken, that sample of the current component is added to the previous total. Conversely, if the time integral of the voltage component is decreasing when the sample of the current component is taken, that sample of the current component is subtracted from the total. The additions and subtractions of the samples of the current component that will result from the grid system of FIG. 1 are shown in FIGS. 2, 3, and 4. FIG. 2 shows the addition of the samples of the current component as the time integral of the voltage component goes from a value of zero to a value of five. FIG. 3 shows the subtractions of the samples of the current component as the time integral of the voltage component goes from a value of five to a value of minus five. All the sample values of the current component are negative, and the subtraction of a minus value results in addition. Therefore, these sample values of the current component are added to the total. Finally, FIG. 4 shows the additions of the sample values of the current component as the time integral of the voltage component goes from minus five to zero. These sample values of the current component are all positive and are therefore added to the previous total. The sum of the sample values of the current component shown in FIGS. 2, 3 and 4 is an approximation of the total area enclosed by the curve 20 which is the power for one period of the current component. In this manner the electrical apparatus determines the energy delivered to the load by the power distribution system. This concludes the discussion of the first principle.

The second and more narrow principle is the use of a digital counter as an integrator. A count rate dN/dt of the digital counter is made to follow a time derivative dI/dt of the current component of an AC electric energy quantity to be measured. That is, $$dI/dt = dN/dt \quad (1)$$

Integrating both sides of equation (1) yields, $$I + I_o = N + N_o \quad (2)$$

where I is the current component, Io the initial condition of the current component, N is the count, and No is the initial condition of the count. If No is equal to Io the count N will be equal to the current component I.

Figure 5:
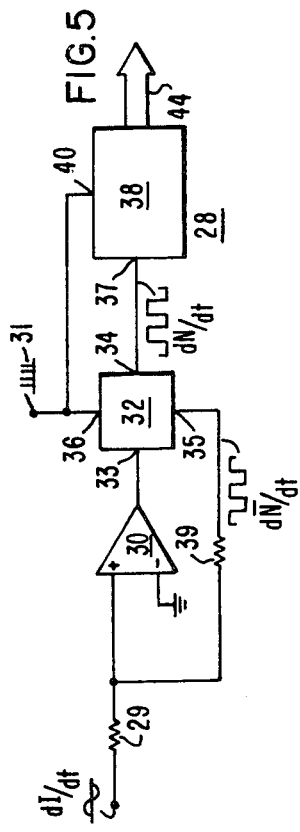
FIG. 5 illustrates a circuit utilizing a counter as an integrator.

A simple block diagram illustrating a circuit 28 utilizing a digital counter as an integrtor is shown in FIG. 5. FIG. 5 also illustrates how a count rate signal dN/dt is made to follow a time derivative signal dI/dt of a current component. The signal dI/dt is input to a non-inverting input terminal of a comparator 30 through a resistor 29. An output terminal of the comparator 30 is connected to an input terminal 33 of a flip-flop 32. The flip-flop 32 receives a 400 KHz clock signal 31 at a clock input terminal 36. The count rate signal dN/dt is produced at an output terminal 34 of the flip-flop 32. At a second output terminal 35 of the flip-flop 32 an inverse signal dN/dt that is the inverse of the count rate signal dN/dt is produced. The inverse signal dN/dt is input to the non-inverting input terminal of the comparator 30 through a resistor 39. The junction between the resistors 29 and 39 is connected to ground by a filtering capacitor 41. An inverting input terminal of the comparator 30 is connected to ground.

The count rate signal dN/dt is input to a counter 38 at an up/down count control terminal 37. The counter 38 receives the clock signal 31 at a clock input terminal 40. A count N which is representative of the magnitude of the current component is available at a set of parallel output terminals 44 of the counter 38.

The count rate signal dN/dt has a first state representative of up counting and a second state representative of down counting. The counter 38 continuously counts (up in response to the first state and down in response to the second state of the count rate signal dN/dt) the clock pulses of the clock signal 31 producing the count N. A duty cycle for the counter 38 is defined as the ratio of the time the counter is counting up divided by the total time. Since the time the counter 38 is counting up is equal to the time the count rate signal dN/dt is in the first state, the duty cycle is expressed as the time the count rate signal is in the first state divided by the total time. Thus, the duty cycle is related to the count rate signal dN/dt. The count N is the integral of the count rate signal dN/dt. Therefore, the count N is related to the duty cycle. From equation (2) the current I is equal to the count N. The count N has already been shown to be related to the duty cycle. Thus, the current I is related to the duty cycle.

For example, when the current I is at a maximum the time derivative signal dI/dt will be zero indicating that the magnitude of the current I is not changing. If the magnitude of the current I is not changing the count N must not change. The count N will not change if the counter 38 counts down for a time period equal to the time period the counter 38 counts up. Since the total time is equal to the time spent counting down plus the time spent counting up, and the time spent counting down is equal to the time spent counting up, a duty cycle of 50% results indicating that the magnitude of the current I is not changing.

Similar analysis will illustrate that a duty cycle between 50% and 100% indicates positively increasing magnitudes of the current I. The closer the duty cycle to 100% the faster the magnitude of the current is increasing in the positive direction. Conversely, a duty cycle between 0% and 50% indicates negatively increasing magnitudes of the current I. The closer the duty cycle to 0% the faster the magnitude of the current is increasing in the negative direction. This concludes the discussion of the second principle.

The use of indicator diagrams for the measurement of AC electrical power and the use of a digital counter as an integrator are the two major principles fundamental to the present invention. The hardware for the implementation of these two principles and the operation of the hardware is described hereinafter in both sections 2 and 3 of this description of the preferred embodiment.

2. Brief Description and Operation of the Meter Apparatus

Figure 6:
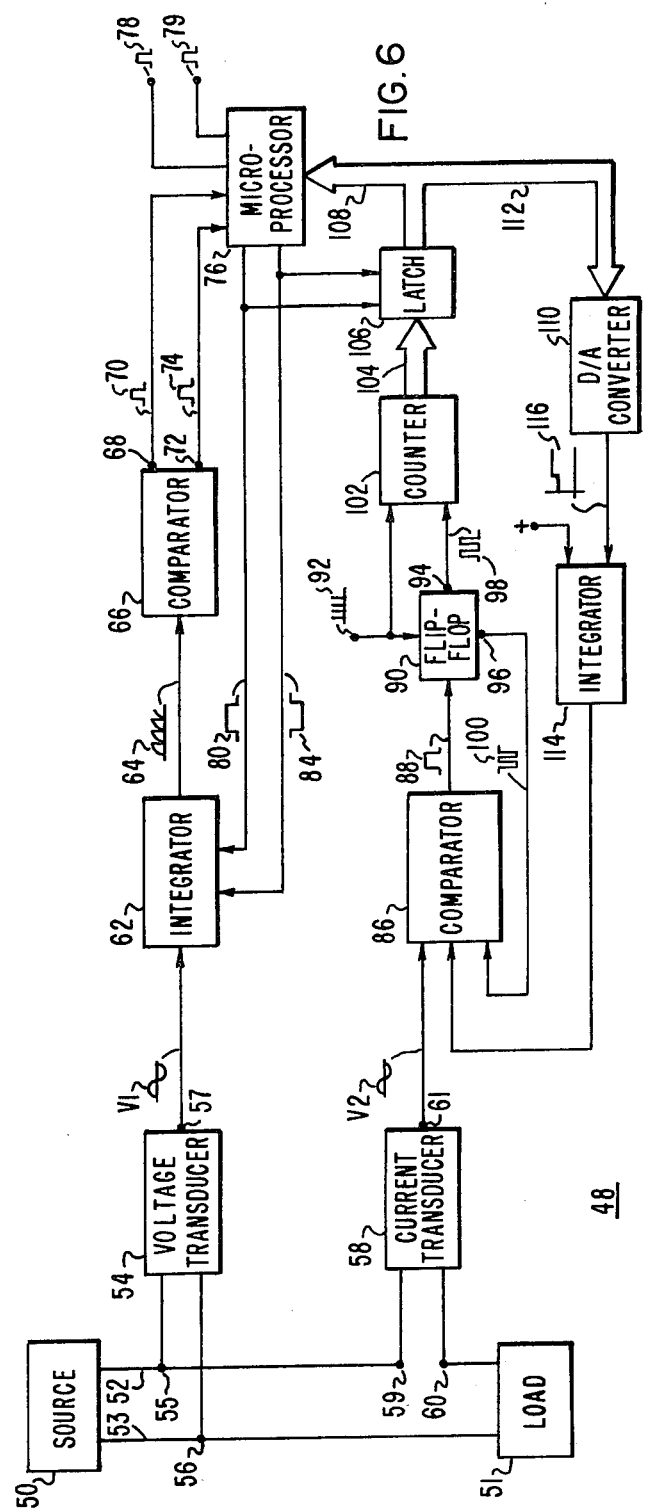
FIG. 6 is a block diagram of a meter apparatus built in accordance with the present invention.

FIG. 6 is a block diagram illustrating a meter apparatus 48 constructed in accordance with the present invention. A source 50 is connected to a load 51 by a pair of conductors 52 and 53. A voltage transducer 54 is connected across the conductors 52 and 53 at input terminals 55 and 56. The voltage transducer 54 produces at an output terminal 57 a first input signal V1 representative of a voltage component of an AC electric energy quantity delivered by the source 50 to the load 51. A current transducer 58 is connected in series with the conductor 52 at input terminals 59 and 60. The current transducer 58 produces at an output terminal 61 a second input signal V2 representative of the time derivative of a current component of the AC electric energy quantity.

The first input signal V1 is input to an integrator 62. The integrator 62 produces an integral signal 64 that is input to a comparator 66. The comparator 66 produces at an output terminal 68 a pulse 70 when the instantaneous magnitude of the integral signal 64 equals the magnitude of a fixed and predetermined high reference potential. The comparator 66 also produces at an output terminal 72 a pulse 74 when the instantaneous magnitude of the integral signal 64 equals a fixed and predetermined low reference potential. The output terminals 68 and 72 of the comparator 66 are connected to a microprocessor 76. The microprocessor 76 produces a first control signal 80 and a second control signal 84 in response to the pulses 70 and 74, respectively, of the comparator 66. The first control signal 80 and the second control signal 84 are input to the integrator 62.

Beginning at the current transducer 58, the second input signal V2 is input to a comparator 86. The comparator 86 produces an output signal 88 which is input to a flip-flop 90. The flip-flop 90 also receives a clock signal 92. The flip-flop 90 has a first output terminal 94 producing a count control signal 98 and a second output terminal 96 producing the inverse of the count control signal 100. The terminal 96 is connected to the comparator 86. The terminal 94 is connected to a counter 102.

The counter 102 receives, in addition to the count control signal 98, the clock signal 92. The counter 102 is connected to a latch 106 by a set of parallel conductors 104. The latch 106 also receives the first control signal 80 and the second control signal 84. The output of the latch 106 is input to the microprocessor 76 by a set of parallel conductors 108.

The output of the latch 106 is also input to a digital-to-analog converter 110 by a set of parallel conductors 112. The digital-to-analog converter 110 produces an analog counterpart signal 116 which is input to an integrator 114. A fixed reference potential is also input to the integrator 114. The output of the integrator 114 is input to the comparator 86.

In operation the meter apparatus 48 shown in FIG. 6 computes the area enclosed by an indicator diagram. Briefly, the comparator 86 receives the second input signal V2 which is representative of the time derivative of the current component. The output signal 88 of the comparator 86 is input to the flip-flop 90. The flip-flop 90 produces the count control signal 98 and the inverse of the count control signal 100. The production of the count control signal 98 is an important feature of this invention and is discussed in detail infra. The inverse of the count control signal 100 is input to the comparator 86 to provide a negative rate of change feedback. The count control signal 98 is input to the counter 102 which produces a digital count N. The digital count N is input to the latch 106 by the parallel conductors 104. The average value of the count N using "offset binary" notation is adjusted to zero by the output signal of the integrator 114 which is input to the comparator 86. The count N is representative of the integral of the second input signal V2. In other words, the count N is representative of the magnitude of the current component.

The sequential operation of the meter apparatus 48 is as follows. The integrator 62 continuously integrates the first input signal V1 producing the integral signal 64. The integral signal 64 represents the $\int e(t)dt$ axis and is monitored by the comparator 66 in order to determine if a unit value along the $\int e(t)dt$ axis has been reached. When a unit value has been reached in the positive direction the output pulse 70 is produced at the output terminal 68 and is input to the microprocessor 76. The microprocessor 76 produces the first control signal 80 in response to the pulse 70. The first control signal 80 resets the integrator 62 and causes the latch 106 to produce a sample value of the digital count N. This sample value is input to the microprocessor 76 by the parallel conductors 108.

Similarly, when a unit value has been reached in the negative direction the output pulse 74 is produced at the output terminal 72 and is input to the microprocessor 76. The microprocessor 76 produces the second control signal 84 in response to the pulse 74. The second control signal 84 resets the integrator 62 and causes the latch 106 to produce a sample value of the digital count N. This sample value is also input to the microprocessor 76 by the parallel conductors 108.

The microprocessor 76 then adds or subtracts, depending upon the sign of the integral of the voltage at the time the unit value was reached, successive sample values producing a totalized value. The totalized value is compared to a digital number representing a positive/negative energy quantity. If the totalized value is greater/less than the digital number representing the positive/negative energy quantity, the microprocessor 76 produces an output pulse 78/79 representative of the positive/negative energy quantity. The digital number representative of the positive/negative energy quantity is then subtracted from the totalized value. The microprocessor 76 returns to the initial step of waiting for the comparator 66 to produce a pulse when a unit value along the $\int e(dt)$ axis has been reached.

A detailed description of both the hardware implementing the present invention and the operation of the hardware is presented in conjunction with FIGS. 7 and 8 hereinafter in Section 3 of this Description of the Preferred Embodiment.

3. Detailed Description and Operation of the Meter Apparatus

Figure 7:
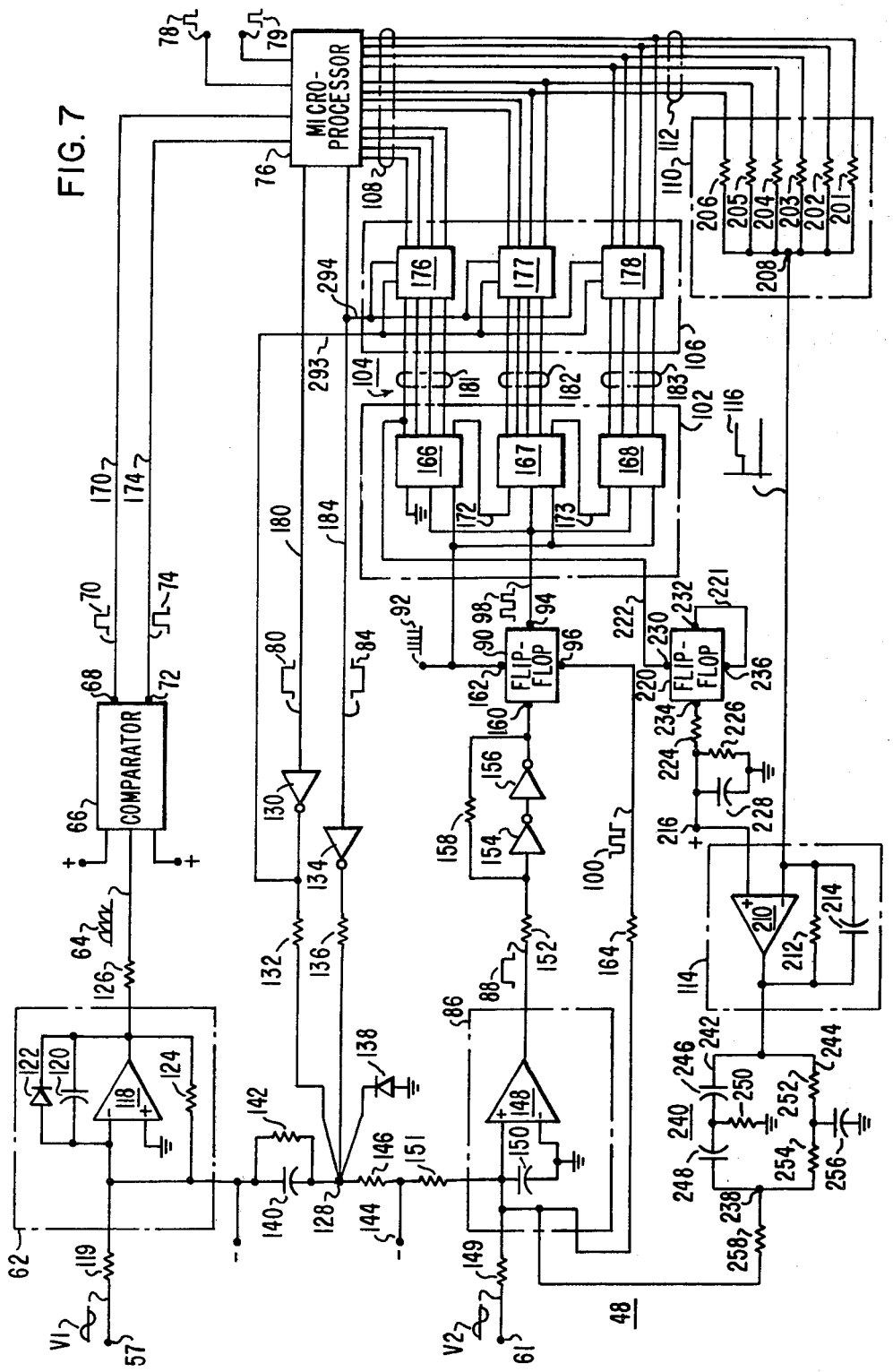
FIG. 7 is an electrical schematic of a meter apparatus built in accordance with the present invention.

A detailed schematic diagram of the meter apparatus 48 is shown in FIG. 7. Beginning at the terminal 57 the first input signal V1 is input to the inverting input terminal of an operational amplifier 118 through a resistor 119. The output terminal of the operational amplifier 118 is connected to the inverting input terminal of the operational amplifier 118 through the parallel combination of a capacitor 120, a diode 122, and a resistor 124. The cathode of the diode 122 is connected to the output terminal of the operational amplifier 118. The inverting input terminal of the operational amplifier 118 is connected to a negative voltage source. The non-inverting input terminal of the operation amplifier 118 is connected to ground. The integral signal 64 is available at the output terminal of the operational amplifier 118.

The integral signal 64 is input to the comparator 66 through a resistor 126. The comparator 66 may be a commercially available comparator circuit such as National Semiconductor Model No. LM339, which is a quad comparator. The quad comparator 66 has a first comparator comparing the integral signal 64 to a fixed and predetermined high reference potential of four volts. The output pulses 70 of the first comparator are available at output terminal 68. The comparator 66 has a second comparator comparing the integral signal 64 to a fixed and predetermined low reference potential of one volt. The output pulses 74 of the second comparator are available at the output terminal 72. The output terminals 68 and 72 are connected to the microprocessor 76 by conductors 170 and 174, respectively.

The microprocessor 76 is a calculating means such as INTEL Model No. C8748. The microprocessor 76 produces the first control signal 80 which is carried by a conductor 180 to a node 128 through the series combination of an inverter 130 and a resistor 132. The microprocessor also produces the second control signal 84 which is carried by a conductor 184 to the node 128 through the series combination of an inverter 134 and a resistor 136. The node 128 is connected to ground through a diode 138. The anode of the diode 138 is connected to ground. The node 128 is also connected to the inverting input terminal of the operational amplifier 118 through the parallel combination of a capacitor 140 and a resistor 142. Finally, the node 128 is connected to a negative voltage source 144 through a resistor 146.

Turning now to the terminal 61, the second input signal V2 is input to the non-inverting input terminal of an operational amplifier 148 through a resistor 149. The non-inverting input terminal of the operational amplifier 148 is connected to ground through a capacitor 150 and is connected to the negative voltage source 144 through a resistor 151. The inverting input terminal of the operational amplifier 148 is connected to ground. The output signal 88 of the comparator 86 is available at the output terminal of the operational amplifier 148. The output signal 88 is input to an input terminal 160 of the flip-flop 90 through the series combination of a resistor 152, a first inverter 154, and a second inverter 156. A resistor 158 connects the input terminal of the first inverter 154 to the output terminal of the second inverter 156. The flip-flop 90 is a D-type flip-flop which receives the clock signal 92 at a clock input terminal 162. The count control signal 98 is available at the output terminal 94 of the flip-flop 90. The inverse count control signal 100 is available at the output terminal 96 of the flip-flop 90. The inverse count control signal 100 is input to the non-inverting input terminal of the operational amplifier 148 through a resistor 164.

The counter 102 is comprised of a first counter 166, a second counter 167, and a third counter 168. The counters 166, 167 and 168 may be commercially available counters such as Fairchild Model No. CD4029A. Each of the counters 166, 167 and 168 has a control input terminal, a clock input terminal, a carry-in terminal, a carry-out terminal, and four data output terminals. The latch 106 is comprised of a first latch 176, a second latch 177, and a third latch 178. The latches 176, 177 and 178 may be commercially available latches such as Fairchild Model No. CD4042A. Each of the latches 176, 177 and 178 has four data input terminals, four data output terminals, and two control terminals. Each of the three counters 166, 167 and 168 receives at its control input terminal the count control signal 98. Each of the three counters 166, 167 and 168 receives at its clock input terminal the clock signal 92. The carry-in terminal of the first counter 166 is connected to ground. The carry-out terminal of the first counter 166 is connected to the carry-in terminal of the second counter 167 by a conductor 172. The carry-out terminal of the second counter 167 is connected to the carry-in terminal of the third counter 168 by a conductor 173. The four data output terminals of the first counter 166 are connected to the four data input terminals of the first latch 176 by the first four conductors 181 of the parallel conductors 104. The four data output terminals of the second counter 167 are connected to the four data input terminals of the second latch 177 by the second four conductors 182 of the parallel conductors 104. The four data output terminals of the third counter 168 are connected to the four data input terminals of the third latch 178 by the last four conductors 183 of the parallel conductors 104. One control input terminal of each of the three latches 176, 177 and 178 receives the second control signal 84. The other control terminal of each of the three latches 176, 177 and 178 receives the inverse of the first control signal 80. The four data output terminals of each of the three latches 176, 177 and 178 are connected to the microprocessor 76 by the parallel conductors 108. The parallel conductors 108 carry the sample values of the digital count N.

The six most significant bits of the sample value of the digital count N are input to the digital-to-analog converter 110 by the parallel conductors 112. Each of the conductors terminates through a resistor 201 through 206 inclusive at a node 208. The analog counterpart signal 116 is available at the node 208.

The least significant bit of the digital count N is input to a clock input terminal 230 of a flip-flop 220 by a conductor 222. The flip-flop 220 is a D-type flip-flop having, in addition to the clock input terminal 230, an input terminal 232, an output terminal 234, and an inverted output terminal 236. The input terminal 232 is connected to the inverting output terminal 236 by a conductor 221. The output terminal 234 is connected to a node 216 by a resistor 224. The node 216 is connected to ground through the parallel combination of a resistor 226 and a capacitor 228.

The analog counterpart signal 116 is input to the inverting input terminal of an operational amplifier 210. The non-inverting input terminal of the operational amplifier 210 is connected to the node 216. The output terminal of the operational amplifier 210 is connected to its inverting input terminal by the parallel combination of a resistor 212 and a capacitor 214. The output terminal of the operational amplifier 210 is connected to the non-inverting input terminal of the operational amplifier 148 through the series combination of a twin-T filter 240 and a resistor 258. The twin-T filter 240 is comprised of a first current path 242 in parallel with a second current path 244. The first current path 242 extends between the output terminal of the operational amplifier 210 and a node 238. The first current path 242 is comprised of a first capacitor 246 in series with a second capacitor 248. The junction point between the two capacitors 246 and 248 is connected to ground through a resistor 250. The second current path 244 likewise extends between the output terminal of the operational amplifier 210 and the node 238. The second current path 244 is comprised of a first resistor 252 in series with a second resistor 254. The junction point of the two resistors 252 and 254 is connected to ground through a capacitor 256. This concludes the description of the hardware of the meter apparatus 48 shown in FIG. 7.

In operation, the meter apparatus 48 shown in FIG. 7 computes the area enclosed by an indicator diagram as discussed in Section 1 of this preferred embodiment. The first input signal V1 is input to the integrator 62 which produces the integral signal 64. The integral signal 64 is input to the comparator 66 wherein the instantaneous magnitude of the integral signal 64 is compared to reference potentials. A plot of the integral signal 64 versus time is shown in FIG. 8A. The first and second control signals 80 and 84 are shown in FIGS. 8B and 8C, respectively. From time T0 to time T1 the capacitor 120 is charging. From time T0 to time T1 the first control signal 80 is in a high, or steady state condition and the second control signal 84 is in a low, or steady state condition. Because of the inverter 130 the inverse of the signal 80 shown in FIG. 8B is delivered to the node 128. Similarly, because of the inverter 134 the inverse of the signal 84 shown in FIG. 8C is delivered to the node 128. At the node 128 the inverse of the signal 80 is zero volts. The inverse of the signal 84 is opposed by the negative voltage source 144 such that an equilibrium or steady state condition results. Therefore, under these conditions, there is no net current flowing through the node 128.

At time T0 in FIG. 8A, the integral signal 64 has an initial value mid-way between the limits of the first and second comparators 66. This is due to the negative bias source connected to the inverting input terminal of the operational amplifier 118. At time T1 the instantaneous magnitude of the integral signal 64 equals the four volt reference potential. At time T1 the output pulse 70 is produced at the output terminal 68 of the comparator 66. The output pulse 70 is input to the microprocessor 76 by the conductor 170. In response to the pulse 70 the first control signal 80 is momentarily, from time T1 to time T2, in the low state as shown in FIG. 8B. The microprocessor 76 controls the duration of the period, from time T1 to time T2, during which the signal 80 is in the low state. This period, shown greatly exaggerated in FIG. 8B, is approximately 75 microseconds. As a result of both the signals 80 and 84 being in the low state not only is the negative voltage source 144 opposed, there is a net positive charge at the node 128. This net positive charge causes a current to flow into the capacitor 120. The current causes the charge on the plate of the capacitor 120 connected to the inverting input terminal of the operational amplifier 118 to increase, and causes the charge on the plate of the capacitor 120 connected to the output terminal of the operational amplifier 118 to decrease. When this charge decreases the magnitude of the integral signal 64 decreases. At time T2 the integral signal 64 has returned to its initial condition of two and one-half volts. The signal 80 then returns to its steady state condition thus allowing the capacitor 120 to charge again.

For negative reset the integral signal 64 begins, at time T3, to increase negatively until, at time T4, the instantaneous magnitude of the integral signal 64 equals the one volt reference potential. At time T4 the comparator 66 produces the output pulse 74 at its output terminal 72. The output pulse 74 is input to the microprocessor 76 by the conductor 174. In response to the pulse 74 the second control signal 84 is momentarily, from time T4 to time T5, in the high stage as shown in FIG. 8C. The microprocessor 76 controls the duration of the period, from time T4 to time T5, during which the signal 84 is in the high state. This period, shown greatly exaggerated in FIG. 8C, is approximately 75 microseconds. As a result of both the signals 80 and 84 being in the high state the negative voltage source 144 is not opposed. There is a net negative charge at the node 128. This net negative charge causes a current to flow from the capacitor 120. The current causes the charge on the plate of the capacitor 120 connected to the inverting input terminal of the operational amplifier 118 to decrease, and causes the charge on the plate of the capacitor 120 connected to the output terminal of the operational amplifier 118 to increase. When this charge increases the magnitude of the integral signal 64 increases. At time T5 the integral signal 64 has returned to its initial condition of two and one-half volts. The signal 84 then returns to its steady state condition thus allowing the capacitor 120 to discharge again.

An advantage of using a current to reset the capacitor 120 is that if the value of the capacitor 120 shifts, the current will reset the capacitor to an appropriate voltage level to compensate for the shift in value. For example, between time T5 and time T6 in FIG. 8A the value of the capacitor 122 suddenly shifts such that the integrator 62 is integrating faster. From time T6 to time T7, the reset time during which the signal 84 is in the high state, that same shift in the value of the capacitor 120 will cause the capacitor to be reset to a higher voltage even though the time period that the signal 84 is in the high state is not longer than the normal reset time of approximately 75 microseconds. The net result of the integrator 62 integrating faster and the capacitor 120 being reset to a higher voltage is that the time period from time T7 to time T8, which is the time period required for the integral signal 64 to again reach the reference potential of one volt, is equal to the time period from time T5 to time T6. Thus, the unit values along the $\int e(t)dt$ axis are kept equal even though the value of the capacitor 120 has shifted. From time T8 to time T9 the capacitor 120 is again reset to an appropriate voltage level to compensate for the change in the speed of integration. An analogous result occurs if the value of the capacitor 120 shifts such that the integrator 62 is integrating slower, or if the value of the capacitor 120 shifts while the integral signal 64 is increasing positively.

Returning to FIG. 7, at the terminal 61 the second input signal V2 is input to the comparator 86. The comparator 86 is biased by the negative voltage source 144 such that the output signal 88 of the comparator 86 has positive and negative values responsive to the positive and negative polarities of the second input signal V2. The inverters 154 and 156 provide a time delay in inputting the signal 88 to the input terminal 160 of the flip-flop 90. This time delay assures that the signal 88 will be in a high or a low state and not in a transitional state. The count control signal 98 is available at the output terminal 94 of the flip-flop 90. The count control signal 98 is the count rate signal dN/dt discussed in Section 1 of this preferred embodiment. The count control signal 98 determines whether the counters 166, 167 and 168 count up or count down. The inverse count control signal 100 available at the output terminal 96 of the flip-flop 90 is input to the comparator 86 to provide a negative rate of change feedback.

The counters 166, 167 and 168 produce the digital count N. The count N is representative of the integral of the second input signal V2. An initial value of the count N is established, as described hereinbelow, which is representative of the condition wherein the integral of the second input signal V2 has a value of zero. A value for the count N above this initial value represents a positive value for the integral of the second input signal V2. Conversely, a value for the count N below this initial value is representative of a negative value of the integral of the second input signal V2. This scheme, called offset binary notation, enables positive and negative analog quantities to be represented by digital counts above and below, respectively, the initial condition. By choosing an initial condition wherein the most significant bit is a one, and all the other bits are zeroes, the most significant bit becomes representative of the polarity of the integral of the second input signal V2.

The latches 176, 177 and 178 produce sample values of the digital count N in response to the first control signal 80 and the second control signal 84. Each latch receives at one of its control input terminals the inverse of the first control signal 80 delivered by a conductor 293. Each of the latches receives at its other control input terminal the second control signal 84 delivered by a conductor 294. The latches 176, 177 and 178 will sample and hold the digital count N thereby producing the sample values of the digital count N when signals of opposite states are present at their control input terminals. Under steady state conditions the inverse of the first control signal 80 is in a low state and the second control signal 84 is in a low state. Under these conditions the latches 176, 177 and 178 will not produce a sample value of the digital count N. Under positive reset conditions the first control signal 80 is momentarily in the low state. The inverse of the first control signal 80 will therefore momentarily be in the high state. The second reset signal 84 will continue to be in the low state thereby satisfying the requirement that the signals at the control input terminals of the latches be of opposite states for the production of a sample value. During this interval when the signals at the control terminals of the latches are of opposite polarity, a sample value of the digital count N will be available at the output terminals of the latches 176, 177 and 178. An analogous situation arises during negative reset wherein the second control signal 84 is momentarily in the high state. This situation will again satisfy the requirement that opposite states be present at the control input terminals of the latches and a sample value of the digital count N will be produced. In conclusion, a sample value of the digital count N will be produced whenever the integrator 62 is either positively or negatively reset. The sample values are input to the microprocessor 76 by the parallel conductors 108.

The initial value of the count N is established as follows. The six most significant bits of the sample value of the digital count N are input to the analog to digital converter 110 by the parallel conductors 112. The digital-to-analog converter 110 produces the analog counterpart signal 116 which is input to the integrator 114. The integrator 114 also receives a positive voltage from the node 216. The positive voltage establishes the initial condition for the count N. The digital to analog converter 110, the integrator 114, and the twin T filter 240 provide a feedback path. The analog counterpart signal 116 produced by the digital to analog converter 110 provides DC stability. The integrator 114 provides the initial condition for the count N. The twin T filter provides appropriate phase shift to compensate for the integrator 114 and the digital to analog converter 110. The resultant signal which is fed back to the comparator 86 thus provides DC stability to the circuit and additionally establishes the initial condition of the count N.

The positive voltage at the node 216 is a constant reference voltage of two and one-half volts. This reference voltage is produced by the capacitor 228 which is continually charged by a charging signal produced by the flip-flop 220. The flip-flop 220 receives the least significant bit of the digital count N at the clock input terminal 230. The least significant bit of the digital count N has a frequency of one-half the frequency of the clock signal. The inverted output terminal 236 is connected to the input terminal 232 by the conductor 221. The charging signal, available at the output terminal 234, has a frequency of one-half the frequency of the least significant bit, or one-fourth the clock frequency. The charging signal is a 100 KHz square wave having a low state of zero volts and a high state of five volts. At the frequency of 100 KHz the capacitor 228 is very precisely charged to the voltage level midway between zero volts and five volts, or two and one-half volts.

The sequential operation of the meter apparatus 48 shown in FIG. 7 may be more easily understood by referring to the flowchart shown in FIG. 9. FIG. 9 outlines the sequence of operations performed by the meter apparatus 48 in determining the area enclosed by the indicator diagram. The program begins at block 265. The first step 267 sets the totalized value stored in the microprocessor 76 to zero. The next step 268 is a decision step wherein the microprocessor 76 interrogates the output terminal 68 of the comparator 66 to determine if the pulse 70 is present. If the pulse 70 is present this indicates that a unit value along the $\int e(t)dt$ axis in the positive direction has been reached and the microprocessor 76 proceeds to step 269 of FIG. 9.

At step 269 the first control signal 80 is momentarily in the low state. In response to the first control signal being in the low state, the latches 176, 177 and 178 produce a sample value of the digital count N at step 269, and the integrator 62 is reset at step 270. The sample value produced at step 269 is added to the totalized value at step 271. Since the most significant bit of the sample value represents the sign of the sample value, sample values having a most significant bit of one are added to the totalized value while sample values having a most significant bit of zero are subtracted from the totalized value. At step 272 a digital number stored in a DC offset register is incremented.

The steps 269, 270, 271, and 272 are carried out only if the decision step 268 is answered affirmatively. If the decision step 268 is answered in the negative, the microprocessor 76 proceeds to step 274. The step 274 is a decision step wherein the output terminal 72 of the comparator 66 is interrogated to determine if the pulse 74 is present. If the pulse 74 is not present the micrprocessor returns to step 268 of FIG. 9. If the pulse 74 is present this indicates that a unit value along the $\int e(t)dt$ axis in the negative direction has been reached and the microprocessor 76 proceeds to step 275 of FIG. 9.

At step 275 the second control signal 84 is momentarily in the high state. In response to the second control signal being in the high state, the latches 176, 177 and 178 produce a sample value of the digital count N at step 275, and the integrator 62 is reset at step 276. The sample value produced at step 275 is subtracted from the totalized value at step 277. Sample values having a most significant bit of one are subtracted from the totalized value while sample values having a most significant bit of zero are added to the totalized value. The digital number stored in the DC offset register is decremented at step 278.

From either step 272 or step 278 the microprocessor 76 proceeds to the decision step 280. At the decision step 280 the totalized value is compared to a digital number Y stored in the microprocessor. The digital number Y represents a quantized unit of electrical energy. If the totalized value is greater than Y the microprocessor 76, at step 281, generates an output pulse 78 representative of a positive unit of electrical energy of magnitude Y. The microprocessor then subtracts, at step 282, the value Y (which the output pulse 78 of step 281 represented) from the totalized value. The microprocessor than proceeds to step 283.

If at the step 280 the totalized value if not greater than Y the microprocessor proceeds to the decision step 284 wherein the totalized value is compared to minus Y. If the totalized value is not less than minus Y the microprocessor 76 proceeds directly to step 283. If at step 284 the totalized value is less than minus Y the microprocessor 76, at step 285, produces an output pulse 79 representative of a negative energy quantity of magnitude Y. At step 286 the value minus Y (which the output pulse 79 of step 285 represented) is subtracted from the totalized value. The microprocessor then proceeds to step 283.

The step 283 is a decision step wherein the microprocessor 76 determines if the DC offset register has overflowed. If the DC offset register has overflowed this is an indication that too many positive sample values have been produced. The microprocessor 76 compensates for the fact that too many positive sample values have been produced by adjusting the DC bias of the integrator 62. This is accomplished at the step 288 by briefly increasing, by approximately five microseconds, the time period during which the first control signal 80 is in the low state. This brief increase effects a correction of the DC bias of the integrator 62. The microprocessor 76 then returns to the decision step 268.

If at the decision step 283 the DC offset register has not overflowed the microprocessor proceeds to the decision step 289. At the decision step 289 the microprocessor 76 determines if the DC offset register has underflowed. If the DC offset register has not underflowed the microprocessor returns to the decision step 268. If at the decision step 289 the DC offset register has underflowed this is an indication that too many negative sample values have been produced. The microprocessor 76 compensates for the fact that too many negative sample values have been produced by adjusting the DC bias of the integrator 62. This is accomplished at step 290 by briefly increasing, by approximately five microseconds, the time period during which the second control signal 84 is in the high state. This brief increase effects a correction of the DC bias of the integrator 62. The microprocessor 76 then proceeds to the decision step 268. This completes the description of the flowchart shown in FIG. 9.

In order to maintain a proper perspective it should be remembered that the steps shown in FIG. 9 are carried out each time a pulse 70 or 74 is present at either output terminal 68 or 72, respectively. At nominal line voltage, approximately 50 sample values are produced during each cycle. At a nominal frequency of 60 Hz, this means that 3,000 sample values are produced per second. In other words, the steps shown in FIG. 9 are carried out approximately 3,000 times each second.

An important feature of the present invention is the production by the microprocessor 76 of the multifunctional control signals 80 and 84. The first control signal 80 has a high, or steady state, and a low state. The second control signal 84 has a low, or steady state, and a high state. The microprocessor 76 controls the duration of the low state of the first signal 80 and the duration of the high state of the second signal 84. There is a one to one correspondence between the low state of the first control signal 80 and each pulse 70 produced at the output terminal 68 of the comparator 66 as discussed in conjunction with FIG. 8A, supra. Similarly, there is a one to one correspondence between the high state of the second control signal 84 and each pulse 74 produced at the output terminal 72 of the comparator 66 as discussed in conjunction with FIG. 8A., supra. The reset and latching functions of the first and second control signals 80 and 84, respectively, has been discussed in conjunction with FIGS. 8B and 8C, supra. Two additional functions performed by the control signals are the introduction of dither and the production of DC offset adjustment voltages for the integrator 62. These two additional functions are discussed in detail hereinafter.

A feature of the present invention is the introduction of dither. Dither is a random shift in the time domain of the integral signal 64. Dither is introduced to randomize the sampling of the second input signal V2. Dither is introduced by the microprocessor 76 each time the first input signal V1 crosses zero going positive, or once each cycle. This occurs at time T10 in FIG. 8A. The duration of the low state of signal 80 initiated at time T11 is briefly increased by 5 microseconds. This increase permits more charge to be removed from the capacitor 120 than was accumulated by the capacitor from time T10 to time T11. Accordingly, the integral signal 64 is reset to a lower voltage such that it takes longer to go from the voltage level at time T12 to the four volt reference level than for any other similar time period such as from time T0 to time T1.

The introduction of dither at time T11 in FIG. 8A looks very much like the situation where the value of the capacitor 120 has shifted and the integral signal 64 is being reset to a different voltage level to compensate for the shift in the value of the capacitor as discussed, supra. However, when the integral signal 64 is reset to a voltage level other than two and one half volts because of changes in the value of the capacitor 120, it is to compensate for the fact that the speed of integration has changed and the different reset voltage is necessary to keep the unit values along the $\int e(t)dt$ axis equal. When the integral signal 64 is reset to a voltage level lower than two and one half volts in order to introduce dither, it is to make one of the unit values along the $\int e(t)dt$ axis slightly larger thus randomizing the subsequent sample values of the second input signal V2. In the present invention the degree of randomization is controlled and is always present.

An important feature of the present invention is the correction of the DC offset voltage of the integrator 62. The integrator 62 requires a biasing voltage and an input offset voltage both of which are integrated and stored by the capacitor 120. Assuming this unwanted charge stored by the capacitor 120 is positive, the reference level of the integral signal 64 shown in FIG. 8A will increase, from time T12 to time T13, to a reference level above two and one-half volts. Over a long time period this will cause more positive sample values to be produced than negative sample values. The purpose of the DC offset correction is to return the reference level of the integral signal 64 to two and one-half volts, and thus, over a long time period, make the number of positive samples equal to the number of negative samples.

The microprocessor 76 determines whether the DC offset register has overflowed, i.e. exceeded a limit of 117, or has underflowed, i.e. is less than a limit of 40. Assuming at time T14 in FIG. 8A the number stored in the DC offset register is 118, the microprocessor will briefly increase the duration of the low state of signal 80 initiated at time T14 by five microseconds. The result of this increase is to return the integral signal 64 to a voltage level closer to two and one-half volts. This will have the corrective effect of producing fewer positive sample values and more negative sample values.

A similar DC offset correction is necessary when the excess charge stored by the capacitor 120 is negative. In this case there is an excess of negative sample values and a shortage of positive sample values. If the number stored in the DC offset register is less than 40 the duration of the next high state of the signal 84 will be increased by five microseconds. This increase will reset the integral signal 64 to a voltage level closer to two and one-half volts. This will have the corrective effect of producing fewer negative sample values and more positive sample values.

The DC offset correction appears to be very similar to the introduction of dither. The purpose of dither, however, is to make one sample value along the $\int e(t)dt$ axis larger than the other sample values. The purpose of the DC offset correction is to make all the sample values along the $\int e(t)dt$ axis equal. The number stored in the DC offset register is a running total of the number of positive samples minus the number of negative samples. By maintaining this number between a high limit of 117 and a low limit of 40 it is possible to assure that the net number of positive samples will be substantially equal to the net number of negative samples over a large time period.

Briefly reviewing the functions of the control signals, the control signals reset the integrator 62 and cause the latch 106 to produce a sample value each time the instantaneous magnitude of the integral signal 64 equals a reference potential. The control signals also periodically introduce dither to randomize the sampling of the second input signal V2. Finally, the control signals correct, whenever necessary, the DC voltage level of the capacitor 120.

In summary, the present invention is for a meter apparatus determining the value of an AC electric energy quantity by determining the area enclosed by an indicator diagram. The invention disclosed herein may be modified by changing the input signals and the programming of the microprocessor 76 in order to calculate other electrical energy quantities. The above discussion related to the calculation of kilowatt hours is intended as an illustration and not a limitation. It is anticipated that additional embodiments of the present invention may be conceived that fall within the scope of the present invention.

What is claimed is:

1. A meter apparatus computing the area of an indicator diagram for determining the value of an AC electric energy quantity defined by a voltage and a current component, and utilizing a counter as an integrator, comprising:

input means producing a first input signal representative of said voltage component and a second input signal representative of the time derivative of said current component;

means integrating said first input signal and producing an integral signal;

means comparing the instantaneous magnitude of said integral signal to the magnitudes of fixed and predetermined reference potentials;

calculating means producing, in response to said means for comparing, two control signals resetting said means for integrating;

means producing, in response to said second input signal, a count control signal having a first state and a second state such that for a given time period the ratio of the time said count control signal is in said first state to said total time period is representative of the rate of change in the magnitude of said second input signal during said time period; and means producing, in response to said count control signal, a digital count representative of the instantaneous magnitude of the time integral of said second input signal, and producing, in response to said control signals, sample values of said digital count, said calculating means accumulating successive sample values and producing totalized values representative of the time integral of the product of said current component times the time integral of said voltage component, said calculating means further producing, in response to said totalized values, output signals representative of said AC electric energy quantity.

2. The meter apparatus of claim 1 wherein the means for comparing has a first output terminal producing an output pulse each time the instantaneous magnitude of the integral signal equals the reference potential of a plus four volts, and has a second output terminal producing an output pulse each time the instantaneous magnitude of said integral signal equals said reference potential of a plus one volt.

3. The meter apparatus of claim 2 wherein the calculating means produces, in response to the pulses of the first output terminal, a first one of the two control signals having a high state and a low state, and produces, in response to the pulses of the second output terminal, a second one of said two control signals having a high state and a low state.

4. The meter apparatus of claim 3 including a means resetting the means for integrating, having a first inverter responsive to the first control signal and a second inverter responsive to the second control signal.

5. The meter apparatus of claim 4 including a negative voltage source, and wherein the first control signal is in the high state and the second control signal is in the low state such that said negative voltage source is cancelled producing a steady state condition.

6. The meter apparatus of claim 5 wherein the first control signal is momentarily in the low state such that current flows into the means for integrating thereby resetting said means for integrating.

7. The meter apparatus of claim 6 wherein the calculating means increments a value when the first control signal is momentarily in the low state.

8. The meter apparatus of claim 7 wherein the duration of the low state of the first control signal is briefly increased in response to the value being above a first fixed and predetermined reference value such that additional current flow into the means for integrating thereby compensating for positive DC offset voltages accumulated by said means for integrating.

9. The meter apparatus of claim 5 wherein the second control signal is momentarily in the high state such that current flows from the means for integrating thereby resetting said means for integrating.

10. The meter apparatus of claim 6 or claim 9 wherein the calculating means controls the duration of the low state of the first control signal and controls the duration of the high state of the second control signal.

11. The meter apparatus of claim 9 wherein the calculating means decrements the value when the second control signal is momentarily in the high state.

12. The meter apparatus of claim 11 wherein the duration of the high state of the second control signal is briefly increased in response to the value being below a second fixed and predetermined reference value such that additional current flows from the means for integrating thereby compensating for negative DC offset voltages accumulated by said means for integrating.

13. The meter apparatus of claim 8 or claim 12 wherein the calculating means controls the duration of the low state of the first control signal and controls the duration of the high state of the second control signal.

14. The meter apparatus of claim 1 wherein the means producing the count control signal includes a comparator having a positive input terminal, a negative input terminal, and an output terminal, and includes a flip-flop responsive to said comparator, said flip-flop having an input terminal, a clock input terminal, an output terminal, and an inverted output terminal.

15. The meter apparatus of claim 14 including a clock means producing a clock signal having a frequency of 400 KHz and wherein the comparator receives the second input signal at the positive input terminal thereof, and wherein the output terminal of said comparator is connected to the input terminal of the flip-flop, and wherein said positive input terminal of said comparator is connected to the inverted output terminal of said flip-flop, and wherein said flip-flop receives said clock signal at the clock input terminal thereof, and wherein the count control signal is produced at the output terminal of said flip-flop.

16. The meter apparatus of claim 15 including a negative voltage source connected to the positive input terminal of the comparator such that said comparator is biased.

17. The meter apparatus of claim 15 including a means providing a delay, said means connected between the output terminal of the comparator and the input terminal of the flip-flop.

18. The meter apparatus of claim 14 wherein the flip-flop is a D-type flip-flop.

19. The meter apparatus of claim 1 wherein the means continuously counting includes a first, a second, and a third counter, each counter having a control input terminal, four data output terminals, a carrying-in terminal, and a carry-out terminal, and includes a first, a second, and a third latch each responsive to one of said counters, each of said latches having four data input terminals, four data output terminals, and two control input terminals.

20. The meter apparatus of claim 19 wherein the control input terminal of each counter receives the count control signal, and wherein the carry-in terminal of the first counter is connected to ground potential, and wherein the carry-out terminal of the first counter is connected to the carry-in terminal of the second counter, and wherein the carry-out terminal of the second counter is connected to the carry-in terminal of the third counter.

21. The meter apparatus of claim 20 wherein the four data input terminals of the first latch are connected to the four data output terminals of the first counter, and wherein the four data input terminals of the second latch are connected to the four data output terminals of the second counter, and wherein the four data input terminals of the third latch are connected to the four data output terminals of the third counter, and wherein one control input terminal of each of said latches receives one of the control signals, and wherein the other control input terminal of each of said latches receives the other of said control signals.

22. The meter apparatus of claim 21 wherein the counters produce, at the data output terminals thereof, the digital count, and wherein the latches produce at the data output terminals thereof, in response to the control signals, the sample values of said digital count.

23. The meter apparatus of claim 1 including a feedback means producing, in response to the sample values, an analog feedback signal that is input to the means producing the count control signal, said feedback means establishing an initial condition for the digital count.

24. The meter apparatus of claim 23 wherein the feedback means includes a digital to analog converter producing an analog counterpart signal representative of the sample values, and includes a capacitor producing a predetermined reference voltage, and includes an integrator receiving said analog counterpart signal and said reference voltage, and includes a twin-T network producing, in response to said integrator, the analog feedback signal.

25. The meter apparatus of claim 24 including a means producing a charging signal, and wherein the capacitor is continuously charged by said charging signal such that said capacitor produces the reference voltage.

26. The meter apparatus of claim 25 wherein the means producing the charging signal includes a flip-flop having a clock input terminal receiving the least significant bit of the digital signal, an input terminal, an inverted output terminal connected to said input terminal, and an output terminal producing said charging signal.

27. The meter apparatus of claim 24 wherein the reference voltage is a DC voltage of 2.5 volts.

28. A meter apparatus computing the area of an indicator diagram for determining the value of an AC electric energy quantity defined by a voltage and a current component, and utilizing a counter as an integrator, comprising: input means producing a first input signal representative of said voltage component and a second input signal representative of the time derivative of said current component; means integrating said first input signal and producing an integral signal; means comparing the instantaneous magnitude of said integral signal to the magnitudes of fixed and predetermined reference potentials; calculating means producing, in response to said means for comparing, two control signals; means resetting, in response to said control signals, said means for integrating; means producing, in response to said second input signal, a count control signal having a first state and a second state such that for a given time period the ratio of the time said count control signal is in said first state to said total time period is representative of the rate of change in the magnitude of said second input signal during said time period; means continuously counting, up in response to said first state of said count control signal and down in response to said second state of said count control signal, and producing, as a result of said continuous counting, a digital count representative of the instantaneous magnitude of the time integral of said second input signal, and producing, in response to said control signals, sample values of said digital count; and feedback means producing, in response to said sample values, an analog feedback signal that is input to said means producing said count control signal for establishing an initial condition for said digital count, said calculating means accumulating successive sample values and producing totalized values representative of the time integral of the product of said current component times the time integral of said voltage component, said calculating means further producing, in response to said totalized values, output signals representative of said AC electric energy quantity.

* * * * *